(12) United States Patent
Kirby et al.

(10) Patent No.: US 11,639,315 B2
(45) Date of Patent: May 2, 2023

(54) BOND COATINGS HAVING A MOLTEN SILICON-PHASE CONTAINED BETWEEN REFRACTORY LAYERS

(71) Applicant: General Electric Company, Schenectady, NY (US)

(72) Inventors: Glen Harold Kirby, Liberty Township, OH (US); Suresh Subramanian, Clifton Park, NY (US); Suresh Viswanathan, Mason, OH (US); James Dale Steibel, Mason, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/697,947

(22) Filed: Sep. 7, 2017

(65) Prior Publication Data
US 2019/0071769 A1    Mar. 7, 2019

(51) Int. Cl.
*C23C 16/04* (2006.01)
*C04B 41/87* (2006.01)
(Continued)

(52) U.S. Cl.
CPC ........ *C04B 41/009* (2013.01); *C04B 41/0072* (2013.01); *C04B 41/52* (2013.01); *C04B 41/87* (2013.01); *C04B 41/89* (2013.01); *C23C 16/045* (2013.01); *C23C 16/24* (2013.01); *F01D 5/282* (2013.01); *F01D 5/288* (2013.01); *F05D 2230/31* (2013.01); *F05D 2230/90* (2013.01); *F05D 2300/222* (2013.01); *F05D 2300/2261* (2013.01); *F05D 2300/6033* (2013.01); *F05D 2300/611* (2013.01)

(58) Field of Classification Search
None
See application file for complete search history.

(56) References Cited

U.S. PATENT DOCUMENTS 5,294,489 A * 3/1994 Luthra .................... B32B 18/00
428/366
5,419,927 A   5/1995 Dietrich
(Continued)

FOREIGN PATENT DOCUMENTS

CN    106966763 A    7/2017
EP    1222961 A3     8/2002
(Continued)

OTHER PUBLICATIONS

Drevet article _J. Mater Sci_ 47_ p. 8247-8260 (2012).*
(Continued)

*Primary Examiner* — Kenneth J Stachel
(74) *Attorney, Agent, or Firm* — Dority & Manning, P.A.

(57) ABSTRACT

A coated component, along with methods of its formation and use, is provided. The coated component may include a substrate having a surface, a first refractory layer on the surface of the substrate, a silicon-based bond coating on the first refractory layer, and an environmental barrier coating on the silicon-based bond coating. The silicon-based bond coating includes a silicon-phase contained within a refractory phase such that, when melted, the silicon-phase is contained within the refractory phase and between the surface of the substrate and an inner surface of the environmental barrier coating.

20 Claims, 4 Drawing Sheets

(51) Int. Cl.
  *F01D 5/28* (2006.01)
  *C04B 41/52* (2006.01)
  *C04B 41/89* (2006.01)
  *C04B 41/00* (2006.01)
  *C23C 16/24* (2006.01)

(56) References Cited

U.S. PATENT DOCUMENTS

| | | | |
|---|---|---|---|
| 6,398,991 B1 | 6/2002 | Brazil et al. | |
| 6,514,629 B1 | 2/2003 | Rigney et al. | |
| 6,893,750 B2 | 5/2005 | Nagaraj et al. | |
| 6,902,836 B2 | 6/2005 | Eaton et al. | |
| 6,929,851 B1 | 8/2005 | Leverenz et al. | |
| 6,974,619 B2 | 12/2005 | Manoharan et al. | |
| 7,060,360 B2 | 6/2006 | Eaton et al. | |
| 7,763,356 B2 | 7/2010 | Berczik et al. | |
| 7,968,217 B2 | 6/2011 | Sarrafi-Nour et al. | |
| 7,989,020 B2 | 8/2011 | Strangman et al. | |
| 8,440,314 B2 | 5/2013 | Morton et al. | |
| 9,133,719 B2 | 9/2015 | Witz et al. | |
| 9,359,505 B2 | 6/2016 | Ii et al. | |
| 9,393,715 B2 | 7/2016 | Krishnan et al. | |
| 9,512,505 B2 | 12/2016 | Weaver et al. | |
| 2004/0234783 A1 | 11/2004 | Eaton et al. | |
| 2005/0048305 A1* | 3/2005 | Ackerman | C23C 28/322 428/544 |
| 2005/0214563 A1 | 9/2005 | Feng et al. | |
| 2008/0178992 A1 | 7/2008 | Pillai et al. | |
| 2010/0080984 A1 | 4/2010 | Lee | |
| 2011/0116920 A1 | 5/2011 | Strock et al. | |
| 2011/0300342 A1 | 12/2011 | Lutjen et al. | |
| 2013/0052415 A1 | 2/2013 | Burns et al. | |
| 2015/0197456 A1 | 7/2015 | Oboodi et al. | |
| 2016/0017749 A1 | 1/2016 | Luthra et al. | |
| 2016/0024962 A1 | 1/2016 | Luthra | |
| 2016/0160337 A1* | 6/2016 | Eminoglu | F01D 5/186 427/272 |
| 2016/0244370 A1* | 8/2016 | Harris | C04B 35/565 |
| 2016/0251272 A1 | 9/2016 | Weaver et al. | |
| 2016/0251970 A1 | 9/2016 | Strock et al. | |
| 2016/0265367 A1 | 9/2016 | Rosenweig et al. | |
| 2017/0073277 A1 | 3/2017 | Shim et al. | |
| 2018/0079689 A1 | 3/2018 | Kirby et al. | |
| 2019/0071358 A1 | 3/2019 | Kirby et al. | |
| 2020/0199031 A1 | 6/2020 | Luthra et al. | |

FOREIGN PATENT DOCUMENTS

| | | |
|---|---|---|
| EP | 1 479 659 A2 | 11/2004 |
| EP | 3037394 A1 | 6/2016 |
| EP | 3141631 A1 | 3/2017 |
| JP | 2004/345944 A | 12/2004 |
| JP | 2016/516153 A | 6/2016 |
| JP | 2016/528131 A | 9/2016 |
| WO | 2014/138108 A1 | 9/2014 |
| WO | WO2018/050084 A1 | 3/2018 |
| WO | WO2018/052739 A1 | 3/2018 |
| WO | WO2018/128676 A1 | 7/2018 |

OTHER PUBLICATIONS

Extended European Search Report and Opinion issued in connection with corresponding EP Application No. 18191157.9 dated Jan. 2, 2019.
Extended European Search Report and Opinion Corresponding to Application No. 18191162.9 dated Dec. 13, 2018.
Extended European Search Report and Opinion Corresponding to Application No. 18191166.0 dated Dec. 14, 2018.
United States Office Action Corresponding to Application No. 15697913 dated Jun. 13, 2019.
United States Office Action Corresponding to Application No. 15697913 dated Dec. 14, 2018.
Davis, J.R., Appendix 1: Melting and Boiling Points of the Elements at Atmospheric Pressure, Metals Handbook; Desk Edition, Second Edition, Dec. 1998, pp. 112-113.
Wasa et al, 5.3 Carbides and Silicides, Thin Film Material Technology—Sputtering of Compound Materials, 2004, pp. v-ix, 345-359, 389-403.
Machine Translated Japanese Office Action Corresponding to Application No. 2018165919 dated Oct. 1, 2019.

* cited by examiner

BOND COATINGS HAVING A MOLTEN SILICON-PHASE CONTAINED BETWEEN REFRACTORY LAYERS

FIELD

The present invention generally relates to bond coatings for use with environmental barrier coatings on ceramic components, along with methods of their formation and use.

BACKGROUND

Higher operating temperatures for gas turbine engines are continuously being sought in order to improve their efficiency. However, as operating temperatures increase, the high temperature durability of the components of the engine must correspondingly increase. Significant advances in high temperature capabilities have been achieved through the formulation of iron, nickel, and cobalt-based superalloys. Still, with many hot gas path components constructed from super alloys, thermal barrier coatings (TBCs) can be utilized to insulate the components and can sustain an appreciable temperature difference between the load-bearing alloys and the coating surface, thus limiting the thermal exposure of the structural component.

While superalloys have found wide use for components used throughout gas turbine engines, and especially in the higher temperature sections, alternative lighter-weight substrate materials have been proposed, such as ceramic matrix composite (CMC) materials. CMC and monolithic ceramic components can be coated with environmental barrier coatings (EBCs) to protect them from the harsh environment of high temperature engine sections. EBCs can provide a dense, hermetic seal against the corrosive gases in the hot combustion environment.

Silicon carbide and silicon nitride ceramics undergo oxidation in dry, high temperature environments. This oxidation produces a passive, silicon oxide scale on the surface of the material. In moist, high temperature environments containing water vapor, such as a turbine engine, both oxidation and recession occurs due to the formation of a passive silicon oxide scale and subsequent conversion of the silicon oxide to gaseous silicon hydroxide. To prevent recession in moist, high temperature environments, environmental barrier coatings (EBC's) are deposited onto silicon carbide and silicon nitride materials.

Currently, EBC materials are made out of rare earth silicate compounds. These materials seal out water vapor, preventing it from reaching the silicon oxide scale on the silicon carbide or silicon nitride surface, thereby preventing recession. Such materials cannot prevent oxygen penetration, however, which results in oxidation of the underlying substrate. Oxidation of the substrate yields a passive silicon oxide scale, along with the release of carbonaceous or nitrous oxide gas. The carbonaceous (i.e., $CO$, $CO_2$) or nitrous (i.e., $NO$, $NO_2$, etc.) oxide gases cannot escape out through the dense EBC and thus, blisters form. The use of a silicon bond coating has been the solution to this blistering problem to date. The silicon bond coating provides a layer that oxidizes (forming a passive silicon oxide layer beneath the EBC) without liberating a gaseous by-product.

However, the presence of a silicon bond coating limits the upper temperature of operation for the EBC because the melting point of silicon metal is relatively low. In use, the silicon bond coating melts at coating temperatures of about 1414° C., which is the melting point of silicon metal. Above these melting temperatures, the silicon bond coating may delaminate from the underlying substrate, effectively removing the bond coat and the EBC thereon. As such, it is desirable to improve the properties of a silicon bond coating in the EBC to achieve a higher operational temperature limit for the EBC.

BRIEF DESCRIPTION

Aspects and advantages of the invention will be set forth in part in the following description, or may be obvious from the description, or may be learned through practice of the invention.

A coated component is generally provided, along with methods of its formation and use. In one embodiment, the coated component may include a substrate having a surface, a first refractory layer on the surface of the substrate, a silicon-based bond coating on the first refractory layer, and an environmental barrier coating on the silicon-based bond coating. The silicon-based bond coating includes a silicon-phase contained within a refractory phase such that, when melted, the silicon-phase is contained within the refractory phase and between the surface of the substrate and an inner surface of the environmental barrier coating.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended Figs., in which.

Figure 1:
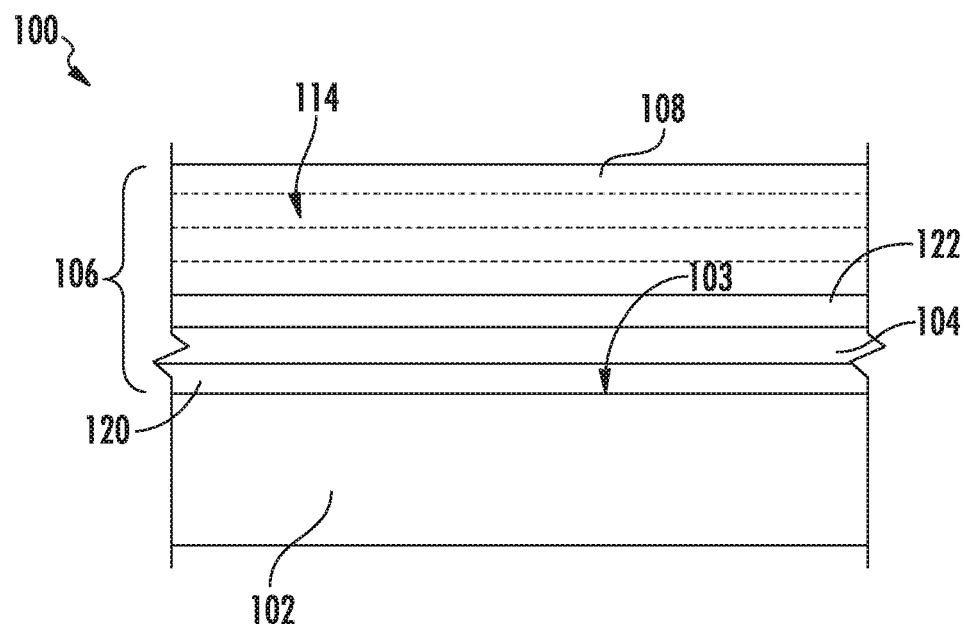
FIG. 1 is a cross-sectional side view of an exemplary coated component including a silicon-based bond coating encased between two refractory layers.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first", "second", and "third" may be used interchangeably to distinguish one component from another and are not intended to signify location or importance of the individual components.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth. As used herein, "Ln" refers to a rare earth element or a mixture of rare earth elements. More specifically, the "Ln" refers to the rare earth elements of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or mixtures thereof.

As used herein, the term "substantially free" means no more than an insignificant trace amount present and encompasses completely free (e.g., 0 molar % up to 0.01 molar %).

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer.

A coated component is generally provided that includes a silicon-based bond coating positioned between the surface of the substrate and an environmental barrier coating (EBC) thereon. Generally, the silicon-based bond coating is formed from a silicon-phase contained within a refractory phase. As explained in greater detail below, the silicon-phase of the silicon-based bond coating may melt during operation of the coated component, while remaining contained within the refractory phase and while keeping the functions of the silicon-based bond coating. Such functions of the silicon-based bond coating may include, but are not limited to, bonding the substrate to the EBC thereon and gettering of oxygen without releasing gas to prevent oxidation of the underlying substrate that would otherwise result in a gaseous by-product. Thus, a liquid silicon-phase may be utilized within the silicon-based bond coating during operation of the coating component (e.g., within a gas turbine engine). Since the silicon-based bond coating continues to function above the melting point of the silicon-phase, the coated component can be operated at temperatures above the melting point of the silicon-phase.

Referring to FIG. 1, an exemplary coated component 100 is shown formed from a substrate 102 having a surface 103 with a coating system 106 thereon. Generally, the coating system 106 includes a first refractory layer 120 on the surface 103 of the substrate 102, a silicon-based bond coating 104 on the first refractory layer 120, an optional second refractory layer 122 on the silicon-based bond coating 104, and an EBC 108 on the optional second refractory layer 122.

Figure 3:
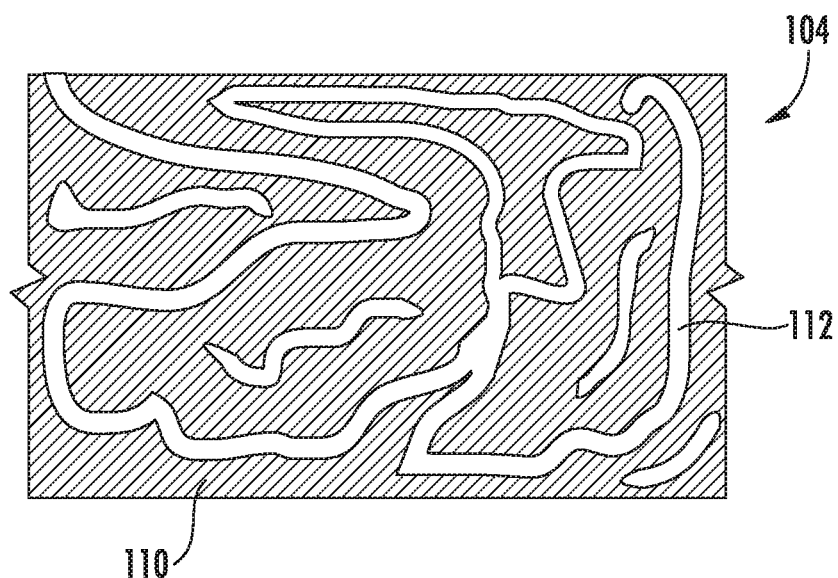
FIG. 3 is a cross-sectional side view of a silicon-based bond coating having intertwined continuous phases of a silicon-phase and a refractory phase.
Figure 4:
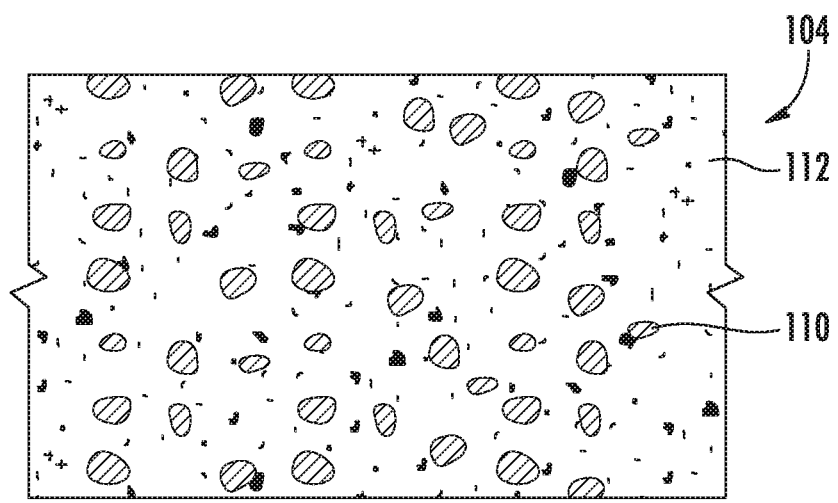
FIG. 4 is a cross-sectional side view of a silicon-based bond coating having a continuous refractory phase with discrete silicon-phases dispersed therein.

The silicon-based bond coating 104 includes silicon-phase contained within a continuous refractory phase. For example, FIG. 3 shows an embodiment of the silicon-based bond coating 104, such as for use in the exemplary coated component 100 of FIG. 1 or 2, having intertwined continuous phases of a silicon-phase 110 and a refractory phase 112. FIG. 4 shows an embodiment of the silicon-based bond coating 104, such as for use in the exemplary coated component 100 of FIG. 1 or 2, having a continuous refractory phase 112 having discrete silicon-phases 110 dispersed therein.

No matter the configuration, the silicon-phase 110 is contained, upon melting, within the refractory phase 112 between the first refractory layer 120 and EBC 108 (e.g., via the optional second refractory layer 122 when present or via a hermetic layer within the EBC 108). For example, the refractory phase 112 may form a 3-dimensional network that spans the thickness of the silicon-based bond coating 104 and is bonded to the first refractory layer 120 (and to the second refractory layer 122, when present). As such, the refractory phase 112 works with the first refractory layer 120 and the optional second refractory layer 122 when present or via a hermetic layer within the EBC 108 to contain the melted silicon-phase therein while keeping the integrity of the silicon-based bond coating 104 without delamination from the surface 103 of the substrate 102. Additionally, during operation at temperatures that melt the silicon-phase 110, the first refractory layer 120 protects the underlying substrate 102 from reaction with molten silicon. Similarly, when present, the second refractory layer 122 protects the EBC 108 from reaction with molten silicon.

The refractory phase 112 is included in the silicon-based bond coating 104 in an amount to provide structural integrity to the silicon-based bond coating 104 while the silicon-phase 110 is melted. Conversely, the silicon-phase 110 is included in the silicon-based bond coating 104 in an amount sufficient to serve as a bonding agent and as a gettering of oxygen. For example, the silicon-based bond coating 104 may, in certain embodiments, include about 25% to about 75% by volume of the silicon-phase 110 and about 25% to about 75% by volume the refractory phase 112 (e.g., about 35% to about 65% by volume of the silicon-phase 110 and about 35% to about 65% by volume the refractory phase 112).

In one particular embodiment, the silicon-phase 110 may be formed from silicon metal, a silicon alloy (e.g., a silicon eutectic alloy), a silicide with a melting point of about 1500° C. or less, or mixtures thereof. As such, the silicon-phase 110 may melt at temperatures of about 1400° C. or greater, depending on the composition of the silicon-phase 110, so as to become molten. For example, the silicon-phase 110 may have at a melting temperature of about 1414° C. to about 1760° C. (e.g., about 1414° C. to about 1485° C.). In particular embodiments, the silicon-phase 110 may be formed from a silicon material that is molten at a bond coating temperature of 1415° C., 1425° C., 1450° C., 1475° C., and/or 1500° C.

In particular embodiments, for example, the silicon-phase 110 may include about 50% by weight or greater of silicon metal, such as about 75% to 100% by weight of silicon metal. Pure silicon metal has a melting point of about 1414° C.

In certain embodiments, a silicide having a melting point of about 1500° C. or less (e.g., about 1400° C. to about 1500° C.) may also be in the silicon-phase 110. Determining the melting point of a particular silicide may be easily achieved using Si phase diagrams. Particularly suitable silicides may include a rare earth and silicon so as to be compatible with the refractory material and/or the EBC material. For example, silicides having a melting point of about 1500° C. or less may include, in one particular embodiment, $Si_{1-x}Y_x$ where x is greater than 0 to about 0.25.

In particular embodiments, the refractory phase 112 is formed from a refractory material set in a 3-dimensional network and having a melting temperature that is greater than the silicon-phase 110. In particular embodiments, the refractory material of the refractory phase 112 has a melting temperature that is about 1500° C. or greater (e.g., about 1550° C. to about 2760° C., which is about melting point of hafnium oxide).

The refractory material may be unreactive with the silicon material of the silicon-phase 110 (e.g., silicon metal). The refractory material may include any suitable refractory material, including but not limited to, rare earth silicates (e.g., rare earth disilicates, rare earth monosilicates, or mixtures thereof), rare earth gallium oxides, hafnium oxide, tantalum oxide, niobium oxide, silicides having a melting point of about 1500° C. or greater (e.g., $Mo_5Si_3$, $MoSi_2$, $ReSi_2$, $ReSi$, $WSi_2$, $W_5Si_3$, $CrSi_2$, rare earth silicides, or mixtures thereof), silicon oxide, or mixtures thereof. In particular embodiments, the refractory material may be doped with boron, gallium, aluminum, or another dopant. Such dopants can control the properties of the coating system 102. For example, the inclusion of a boron dopant may inhibit and prevent crystallization of a thermal growth oxide ("TGO") on the silicon-based bond coating by raising the crystallization temperature without greatly accelerating the growth rate of the TGO. That is, the introduction of boron (B) within the silicon-based bond coating keeps the TGO (i.e., the SiO) in an amorphous phase. Accordingly, the operating temperature of the silicon-based bond coating (and thus the TGO and EBC coating) can be increased. Additionally, boron-doped refractory compounds have limited reaction with and/or solubility into in silicon oxide, which can limit the rate of oxide scale growth. In one embodiment, the materials of the silicon-phase 110 and the refractory phase are compatible with each other. For example, the silicon material of the silicon-phase 110 may have good wetting with the refractory material (such as when the refractory material includes a rare earth silicate or a silicide).

Generally, the silicon-based bond coating 104 is relatively thin. The silicon-based bond coating 104 may have a thickness that is about 25 micrometers (μm) to about 275 μm, such as about 25 μm to about 150 μm (e.g., about 25 μm to about 100).

Figure 2:
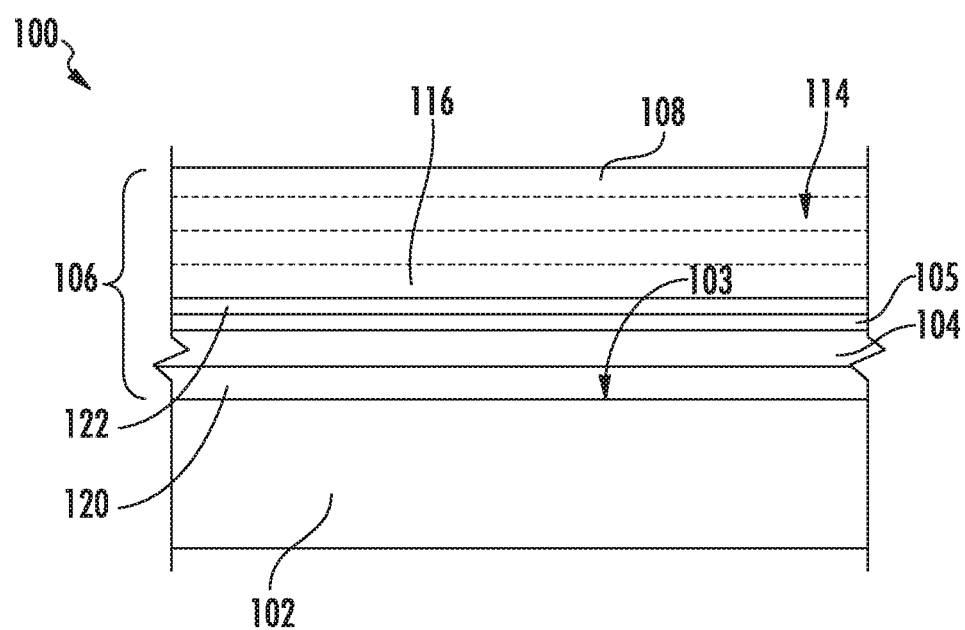
FIG. 2 is a cross-sectional side view of another exemplary coated component including a silicon-based bond coating encased between two refractory layers and having a TGO layer thereon.

FIG. 2 shows a thermally grown oxide ("TGO") layer 105, which may form on the surface of the silicon-based bond coating 104, such as a layer of silicon oxide (sometimes referred to as "silicon oxide scale" or "silica scale"), during exposure to oxygen (e.g., during manufacturing and/or use) of the component 100.

Referring FIGS. 1 and 2, the substrate 102 may be formed from a ceramic matrix composite ("CMC") material, such as a silicon based, non-oxide ceramic matrix composite. As used herein, "CMC" refers to a silicon-containing, or oxide-oxide, matrix and reinforcing material. As used herein, "monolithic ceramics" refers to materials without fiber reinforcement (e.g., having the matrix material only). Herein, CMCs and monolithic ceramics are collectively referred to as "ceramics."

Some examples of CMCs acceptable for use herein can include, but are not limited to, materials having a matrix and reinforcing fibers comprising non-oxide silicon-based materials such as silicon carbide, silicon nitride, silicon oxycarbides, silicon oxynitrides, and mixtures thereof. Examples include, but are not limited to, CMCs with silicon carbide matrix and silicon carbide fiber; silicon nitride matrix and silicon carbide fiber; and silicon carbide/silicon nitride matrix mixture and silicon carbide fiber. Furthermore, CMCs can have a matrix and reinforcing fibers comprised of oxide ceramics. Specifically, the oxide-oxide CMCs may be comprised of a matrix and reinforcing fibers comprising oxide-based materials such as aluminum oxide ($Al_2O_3$), silicon dioxide ($SiO_2$), aluminosilicates, and mixtures thereof. Aluminosilicates can include crystalline materials such as mullite ($3Al_2O_3 \cdot 2SiO_2$), as well as glassy aluminosilicates.

As stated above, the first refractory layer 120 is positioned between the silicon-based bond coating 104 and the surface 103 of the substrate 102 such that, during operation at temperatures that melt the silicon-phase 110, the first refractory layer 120 may protect the underlying substrate 102 from reaction with molten silicon. For example, when Si metal is included within the silicon-phase 110, a liquid Si metal may dissolve silicon carbide in the substrate 102. Such an interaction between the liquid silicon phase 110 and the substrate may be inhibited through the presence of the first refractory layer 120. Generally, the first refractory layer 120 is relatively thin so as to allow for the silicon-based bond coating 104 to at least partially perform its bonding function with the underlying substrate 102, while remaining sufficiently thick to protect the substrate 102 from reaction with molten silicon material during use at such temperatures. In particular embodiments, the first refractory layer 120 may have a thickness that is about 5 micrometers (μm) to about 100 μm, such as about 10 μm to about 50 μm.

Generally, the first refractory layer 120 includes a refractory material that has a melting point that is greater than that of the silicon phase (e.g., about 1500° C. or greater) while being compatible with the refractory material of the refractory phase 112 within the silicon-based bond coating 104 while being unreactive with the silicon material of the silicon phase 110. However, the refractory material of the first refractory layer 120 may be independently selected from the refractory material of the refractory phase 112 within the silicon-based bond coating 104. That is, in certain embodiments, the refractory material of the first refractory layer 120 and the refractory phase 112 within the silicon-based bond coating 104 may be a substantially identical, in terms of chemical composition. However, in other embodiments, the refractory material of the first refractory layer 120 can be different, in terms of chemical composition, than the refractory phase 112 within the silicon-based bond coating 104.

The refractory material of the first refractory layer 120 may include any suitable refractory material, including but not limited to, rare earth silicates (e.g., rare earth disilicates, rare earth monosilicates, or mixtures thereof), rare earth gallium oxides, hafnium oxide, tantalum oxide, niobium oxide, silicides having a melting point of about 1500° C. or greater (e.g., $Mo_5Si_3$, $MoSi_2$, $ReSi_2$, $ReSi$, $WSi_2$, $W_5Si_3$, $CrSi_2$, rare earth silicides, or mixtures thereof), silicon oxide, or mixtures thereof. In particular embodiments, the refractory material of the first refractory layer 120 may be doped with boron, gallium, aluminum, or another dopant.

Since the first refractory layer 120 is protected within the coating system from exposure to steam or other CMAS by the overlying layers, the first refractory layer 120 may include other refractory materials that do not substantially wet out with the liquid silicon-phase material.

As stated above, the optional second refractory layer 122 may be present between the silicon-based bond coating 104 and the EBC 108 such that, during operation at temperatures that melt the silicon-phase 110, the second refractory layer 122 may protect materials within the EBC 108 from reaction with molten silicon. Generally, the second refractory layer 122 is relatively thin so as to allow for the silicon-based bond coating 104 to at least partially perform its bonding function with the EBC 108, while remaining sufficiently thick to protect the EBC 108 from reaction with molten silicon material during use at such temperatures. In particular embodiments, the second refractory layer 122 may have a thickness that is about 5 micrometers (μm) to about 100 μm, such as about 10 μm to about 50 μm.

The second refractory layer 122 generally includes a refractory material that is compatible with the refractory material of the refractory phase 112 within the silicon-based bond coating 104 while being unreactive with the silicon material of the silicon phase 110. The refractory material of the second refractory layer 122 may be independently selected from the refractory material of the refractory phase 112 within the silicon-based bond coating 104 and/or the first refractory layer 120. That is, in certain embodiments, the refractory material of the second refractory layer 122 and the refractory phase 112 within the silicon-based bond coating 104 may be a substantially identical, in terms of chemical composition. However, in other embodiments, the refractory material of the second refractory layer 122 can be different, in terms of chemical composition, than the refractory phase 112 within the silicon-based bond coating 104. Similarly, the refractory material of the second refractory layer 122 may be the same or different, in terms of chemical composition, than the first refractory layer 120.

The refractory material of the second refractory layer 122 may include any suitable refractory material, including but not limited to, rare earth silicates (e.g., rare earth disilicates, rare earth monosilicates, or mixtures thereof), rare earth gallium oxides, hafnium oxide, tantalum oxide, niobium oxide, silicides having a melting point of about 1500° C. or greater (e.g., $Mo_5Si_3$, $MoSi_2$, $ReSi_2$, ReSi, $WSi_2$, $W_5Si_3$, $CrSi_2$, rare earth silicides, or mixtures thereof), silicon oxide, or mixtures thereof. In particular embodiments, the refractory material of the second refractory layer 122 may be doped with boron, gallium, aluminum, or another dopant.

Similar to the first refractory layer 120, the second refractory layer 122 is protected within the coating system from exposure to steam or other CMAS by the overlying layers, the second refractory layer 122 may include other refractory materials that do not wet out with the liquid silicon-phase material. For example, the first refractory layer 120 and/or the second refractory layer 122 may include non-wetting refractory materials, including but not limited to, mullite, hafnium oxide, silicon oxide (amorphous), silicon oxide (amorphous) reinforced with a particle (e.g., SiC, $Si_3N_4$, rare earth disilicate, mullite), or silicon oxide (amorphous) reinforced with a fiber (e.g., SiC). Such non-wetting, non-reactive materials are particularly suitable for forming the first refractory layer 120 and/or the second refractory layer 122. However, in alternative embodiments, the first refractory layer 120 and/or the second refractory layer 122 could also include materials that wet, but are non-reactive with molten silicon, including by not limited to, rare earth monosilicate, rare earth disilicate, rare earth gallium oxide (monoclinic, $Ln_4Ga_2O_9$), rare earth aluminum oxide (monoclinic, $Ln_4Al_2O_9$), or aluminum nitride.

As stated above, the silicon-based bond coating 104 may be used in conjunction with an EBC 108 to form a coated component 100 with an increased operating temperature compared to that using only a silicon bond coating (without the refractory phase). The EBC 108 may include any combination of one or more layers formed from materials selected from typical EBC or thermal barrier coating ("TBC") layer chemistries, including but not limited to rare earth silicates (e.g., mono-silicates and di-silicates), aluminosilicates (e.g., mullite, barium strontium aluminosilicate (BSAS), rare earth aluminosilicates, etc.), hafnia, zirconia, stabilized hafnia, stabilized zirconia, rare earth hafnates, rare earth zirconates, rare earth gallium oxide, etc.

As stated, the EBC 108 may be formed from a plurality of individual layers 114. In the embodiments shown, EBC 108 includes a hermetic layer 116 positioned in directly on the silicon-based bond coating 104 so as to further encase the silicon phase 110, upon melting, within the silicon-based bond coating 104. Such a hermetic layer 116 may be utilized with or without the presence of the optional second refractory layer 122.

The coated component 100 is particularly suitable for use as a component found in high temperature environments, such as those present in gas turbine engines, for example, combustor components, turbine blades, shrouds, nozzles, heat shields, and vanes. In particular, the turbine component can be a CMC component positioned within a hot gas flow path of the gas turbine such that the coating system 106 forms an environmental barrier for the underlying substrate 102 to protect the component 100 within the gas turbine when exposed to the hot gas flow path.

Figure 5:
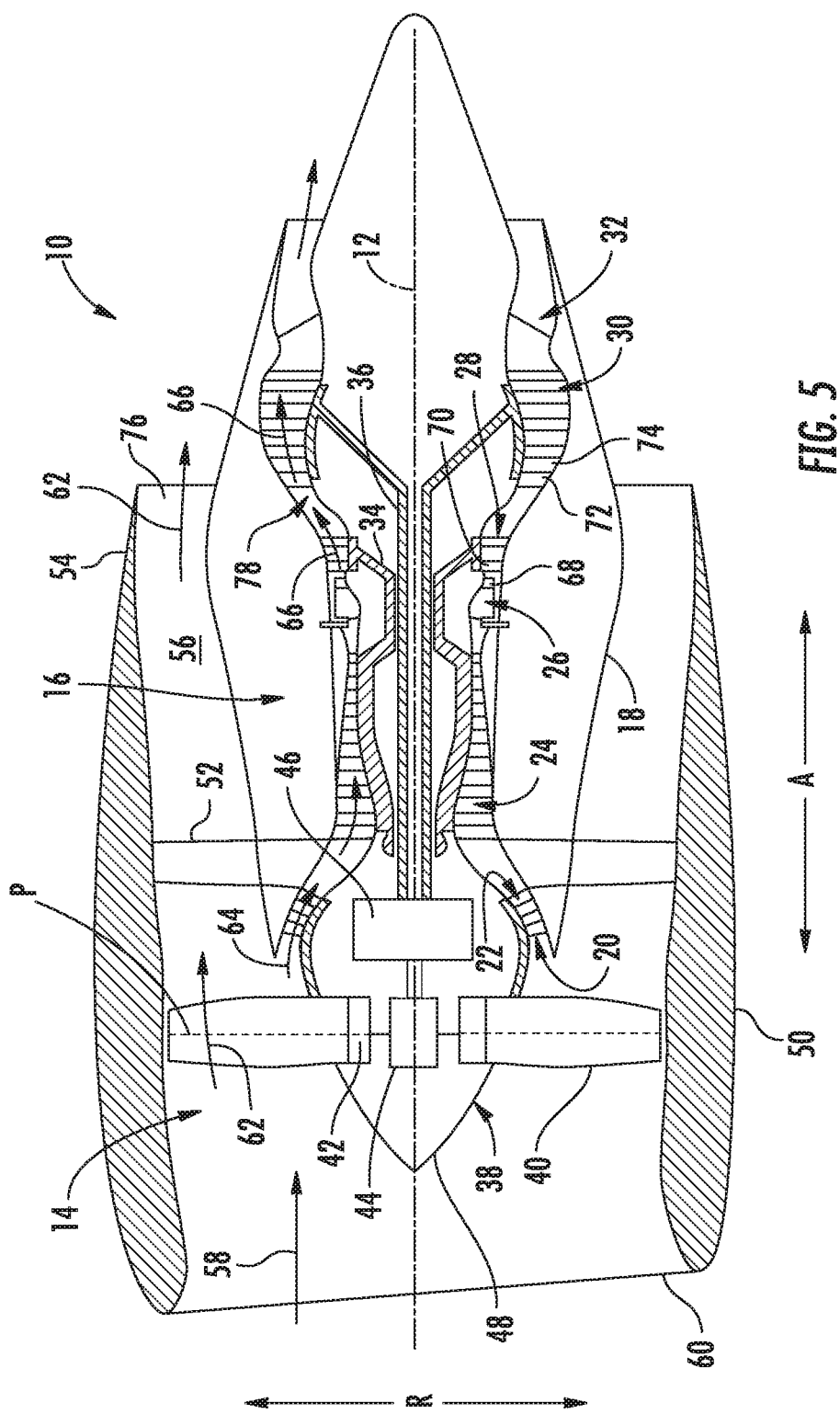
FIG. 5 is a schematic cross-sectional view of an exemplary gas turbine engine according to various embodiments of the present subject matter.

FIG. 5 is a schematic cross-sectional view of a gas turbine engine in accordance with an exemplary embodiment of the present disclosure. More particularly, for the embodiment of FIG. 5, the gas turbine engine is a high-bypass turbofan jet engine 10, referred to herein as "turbofan engine 10." As shown in FIG. 5, the turbofan engine 10 defines an axial direction A (extending parallel to a longitudinal centerline 12 provided for reference) and a radial direction R. In general, the turbofan 10 includes a fan section 14 and a core turbine engine 16 disposed downstream from the fan section 14. Although described below with reference to a turbofan engine 10, the present disclosure is applicable to turbomachinery in general, including turbojet, turboprop and turboshaft gas turbine engines, including industrial and marine gas turbine engines and auxiliary power units.

The exemplary core turbine engine 16 depicted generally includes a substantially tubular outer casing 18 that defines an annular inlet 20. The outer casing 18 encases, in serial flow relationship, a compressor section including a booster or low pressure (LP) compressor 22 and a high pressure (HP) compressor 24; a combustion section 26; a turbine section including a high pressure (HP) turbine 28 and a low pressure (LP) turbine 30; and a jet exhaust nozzle section 32. A high pressure (HP) shaft or spool 34 drivingly connects the HP turbine 28 to the HP compressor 24. A low pressure (LP) shaft or spool 36 drivingly connects the LP turbine 30 to the LP compressor 22.

For the embodiment depicted, the fan section 14 includes a variable pitch fan 38 having a plurality of fan blades 40 coupled to a disk 42 in a spaced apart manner. As depicted, the fan blades 40 extend outwardly from disk 42 generally along the radial direction R. Each fan blade 40 is rotatable relative to the disk 42 about a pitch axis P by virtue of the fan blades 40 being operatively coupled to a suitable actuation member 44 configured to collectively vary the pitch of the fan blades 40 in unison. The fan blades 40, disk 42, and actuation member 44 are together rotatable about the longitudinal axis 12 by LP shaft 36 across an optional power gear box 46. The power gear box 46 includes a plurality of gears for stepping down the rotational speed of the LP shaft 36 to a more efficient rotational fan speed.

Referring still to the exemplary embodiment of FIG. 5, the disk 42 is covered by rotatable front nacelle 48 aerodynamically contoured to promote an airflow through the plurality of fan blades 40. Additionally, the exemplary fan section 14 includes an annular fan casing or outer nacelle 50 that circumferentially surrounds the fan 38 and/or at least a portion of the core turbine engine 16. It should be appreciated that the nacelle 50 may be configured to be supported relative to the core turbine engine 16 by a plurality of circumferentially-spaced outlet guide vanes 52. Moreover, a downstream section 54 of the nacelle 50 may extend over an outer portion of the core turbine engine 16 so as to define a bypass airflow passage 56 therebetween.

During operation of the turbofan engine 10, a volume of air 58 enters the turbofan 10 through an associated inlet 60 of the nacelle 50 and/or fan section 14. As the volume of air 58 passes across the fan blades 40, a first portion of the air 58 as indicated by arrows 62 is directed or routed into the bypass airflow passage 56 and a second portion of the air 58 as indicated by arrow 64 is directed or routed into the LP compressor 22. The ratio between the first portion of air 62 and the second portion of air 64 is commonly known as a bypass ratio. The pressure of the second portion of air 64 is then increased as it is routed through the high pressure (HP) compressor 24 and into the combustion section 26, where it is mixed with fuel and burned to provide combustion gases 66.

The combustion gases 66 are routed through the HP turbine 28 where a portion of thermal and/or kinetic energy from the combustion gases 66 is extracted via sequential stages of HP turbine stator vanes 68 that are coupled to the outer casing 18 and HP turbine rotor blades 70 that are coupled to the HP shaft or spool 34, thus causing the HP shaft or spool 34 to rotate, thereby supporting operation of the HP compressor 24. The combustion gases 66 are then routed through the LP turbine 30 where a second portion of thermal and kinetic energy is extracted from the combustion gases 66 via sequential stages of LP turbine stator vanes 72 that are coupled to the outer casing 18 and LP turbine rotor blades 74 that are coupled to the LP shaft or spool 36, thus causing the LP shaft or spool 36 to rotate, thereby supporting operation of the LP compressor 22 and/or rotation of the fan 38.

The combustion gases 66 are subsequently routed through the jet exhaust nozzle section 32 of the core turbine engine 16 to provide propulsive thrust. Simultaneously, the pressure of the first portion of air 62 is substantially increased as the first portion of air 62 is routed through the bypass airflow passage 56 before it is exhausted from a fan nozzle exhaust section 76 of the turbofan 10, also providing propulsive thrust. The HP turbine 28, the LP turbine 30, and the jet exhaust nozzle section 32 at least partially define a hot gas path 78 for routing the combustion gases 66 through the core turbine engine 16.

Figure 6:
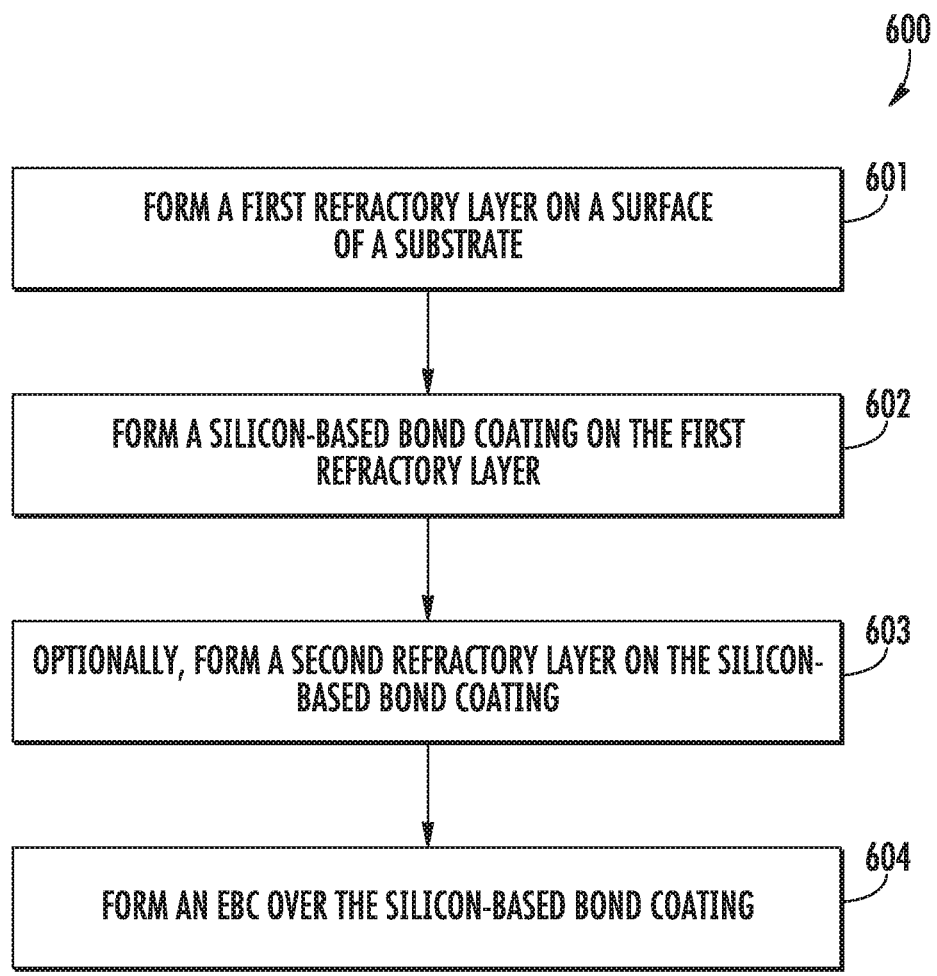
FIG. 6 is a diagram of an exemplary method of forming a silicon-based bond coating with a silicon-phase contained within a continuous phase of a refractory phase.

Methods are also generally provided for coating a ceramic component. For example, FIG. 6 shows a diagram of an exemplary method 600 of forming a coating system on a surface of a substrate. At 601, a first refractory layer is formed on the surface of the substrate, such as described above with respect to first refractory layer 120 described above. At 602, a silicon-based bond coating is formed on the first refractory layer to include a silicon-phase contained within a refractory phase, such as described above with respect to silicon-based bond coating 104.

In one embodiment, the silicon-based bond coating is formed using a porous sacrificial material, such as a foam or sponge. A slurry of the refractory material, such as described above, may be infiltrated into pores of the porous sacrificial material (e.g., using a slurry containing the refractory material, and optionally sintering agents). Before or after infiltration, the porous sacrificial material may be placed onto the surface of the substrate (e.g., directly on the surface 103 of the substrate 102 shown in FIGS. 1 and 2). Thereafter, the porous sacrificial material infiltrated with the slurry of refractory material may be heated to (1) burn out the porous sacrificial material (e.g., about 400° C. to about 750° C.) and (2) set the refractory material as the refractory phase defining pores therein (e.g., at about 1000° C. to about 1500° C.). Finally, the silicon material (e.g., silicon metal) may be infiltrated into the pores defined within the refractory phase to form the silicon-based bond coating on the surface of the substrate. For example, the silicon material may be infiltrated into the pores of the refractory phase via a melt infiltration process using silicon metal and/or chemical vapor infiltration using silicon metal.

In an alternative embodiment, a slurry of the silicon-phase material (e.g., silicon metal) and the refractory material may be mixed together at the desired ratio and then applied onto the surface to be coated. Then, upon sintering of the applied slurry, a mixed layer may be formed. In particular embodiments, sintering may be performed at a temperature where the silicon-phase material is melted (e.g., at about 1415° C. or greater, such as about 1415° C. to about 1700° C.) to ensure mixing of the silicon-phase material and the refractory material.

At 603, a second refractory layer may optionally be formed on the silicon-based bond coating. In one embodiment, the refractory material of the second refractory layer may be heated to bond with the refractory material of the refractory phase of the silicon-based bond layer. At 604, an environmental barrier coating (EBC) is formed over the silicon-based bond coating (e.g., on the second refractory layer). As described above, the silicon-phase, when melted, is contained within refractory phase between the first refractory layer and the second refractory layer, when present, and/or an inner surface of the environmental barrier coating.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A coated component, comprising:
   a substrate having a surface;
   a first refractory layer on the surface of the substrate;
   a silicon-based bond coating on the first refractory layer, wherein the silicon-based bond coating comprises a silicon-phase contained within a continuous refractory phase; and
   an environmental barrier coating on the silicon-based bond coating, wherein the coated silicon-phase melts at a silicon-based bond coating temperature of 1400 ° C. or greater during operation of the coated component and, melted, silicon-phase is contained within the continuous refractory phase and between the first refractory layer and an inner surface of the environmental barrier coating.

2. The coated component as in claim 1, wherein the first refractory layer is directly on the surface of the substrate, and wherein the silicon-based bond coating is directly on the first refractory layer.

3. The coated component as in claim 1, wherein the first refractory layer has a thickness that is 5 μm to 100 μm.

4. The coated component as in claim 1, wherein the first refractory layer has a melting point that is greater than a melting point of the silicon-phase.

5. The coated component as in claim 1, wherein the first refractory layer comprises a rare earth silicate, a rare earth gallium oxide, hafnium oxide, tantalum oxide, niobium oxide, a silicide having a melting point of 1500° C. or greater, or a mixture thereof.

6. The coated component as in claim 1, wherein the first refractory layer comprises a refractory material that does not substantially wet out with the melted silicon-phase.

7. The coated component as in claim 1, wherein the silicon- phase comprises silicon metal, a silicon alloy, a silicide having a melting point of 1500° C. or less, or a mixture thereof.

8. The coated component as in claim 1, wherein the silicon-phase comprises silicon metal in an amount of 50% to 100% by weight.

9. The coated component as in claim 1, wherein the silicon-phase and the continuous refractory phase form intertwined continuous phases.

10. The coated component as in claim 1, wherein the silicon-phase forms a plurality of discrete particulate phases within the continuous refractory phase.

11. The coated component as in claim 1, wherein the continuous refractory phase of the silicon-based bond coating and the first refractory layer comprise a material having a melting point that is greater than the melting point of the silicon-phase, and wherein the silicon-based bond coating includes 25% to 75% by volume of the silicon-phase and 25% to 75% by volume of the continuous_refractory phase.

12. The coated component as in claim 1, wherein the continuous refractory phase of the silicon-based bond coating and the first refractory layer comprise a rare earth silicate, a rare earth gallium oxide, hafnium oxide, tantalum oxide, niobium oxide, a silicide, silicon oxide, or a mixture thereof.

13. The coated component as in claim 1, wherein the environmental barrier coating comprises a plurality of layers with at least one of the layers of the environmental barrier coating comprising a hermetic layer, and wherein the hermetic layer is an inner most layer of the environmental barrier coating closest to the silicon-based bond coating, and wherein the substrate is a ceramic matrix composite (CMC) comprising silicon carbide, silicon nitride, or a combination thereof, and wherein the substrate comprises a plurality of CMC plies.

14. The coated component as in claim 1, further comprising:
a second refractory layer positioned between the silicon-based bond coating and the environmental barrier coating.

15. The coated component as in claim 14, wherein the second refractory layer is directly on the silicon-based bond coating, and wherein the environmental barrier coating is directly on the second refractory layer.

16. The coated component as in claim 14, wherein the continuous refractory phase has a three-dimensional network that spans a thickness of the silicon-based bond coating and is bonded to the first refractory layer and to the second refractory layer.

17. A method of forming a coated component, the method comprising:
forming a first refractory layer on a surface of a substrate;
forming a silicon-based bond coating on the first refractory layer, wherein the silicon-based bond coating comprises a silicon-phase contained within a continuous refractory phase; and
forming an environmental barrier coating on the silicon-based bond coating, wherein the silicon-phase melts at a silicon-based bond coating temperature of 1400° C. or greater during operation and, melted, silicon-phase is contained within the continuous refractory phase between the first refractory layer and an inner surface of the environmental barrier coating.

18. The method of claim 17, further comprising:
prior to forming the environmental barrier coating, forming a second refractory layer on the silicon-based bond coating such that the melted silicon-phase, is contained within the continuous refractory phase between the first refractory layer and the second refractory layer.

19. The method of claim 17, wherein forming a silicon-based bond coating on the first refractory layer comprises:
infiltrating a porous sacrificial material with a slurry of refractory material;
applying the porous sacrificial material onto the first refractory layer;
thereafter, heating the porous sacrificial material infiltrated with the slurry of refractory material to burn out the porous sacrificial material and set the refractory material as the continuous refractory phase defining pores therein; and
infiltrating silicon into the pores defined within the continuous refractory phase to form the silicon-based bond coating on the first refractory layer.

20. The method of claim 17, wherein forming a silicon-based bond coating on the first refractory layer comprises:
applying a mixture of a refractory material and a powder of silicon metal onto the first refractory layer;
heating the mixture to a temperature such that the refractory material sets as the continuous continuous refractory phase and the silicon metal melts to fill pores within the refractory phase; and
cooling the mixture such that the silicon metal forms the silicon phase within the pores defined within the continuous refractory phase to form the silicon-based bond coating on the first refractory layer.

* * * * *